Feb. 26, 1963 V. HABA 3,079,455
METHOD AND MATERIALS FOR OBTAINING LOW RESISTANCE BONDS TO BISMUTH TELLURIDE
Original Filed Sept. 14, 1956
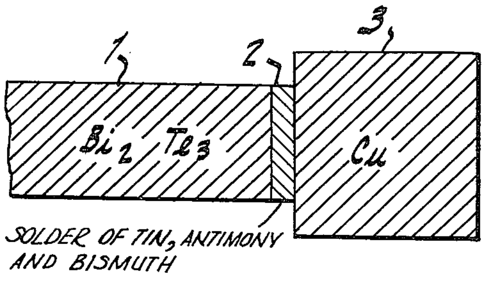
INVENTOR.
VINCENT HABA
BY
W. S. Hill
AGENT United States Patent Office 3,079,455
Patented Feb. 26, 1963

3,079,455

METHOD AND MATERIALS FOR OBTAINING LOW RESISTANCE BONDS TO BISMUTH TELLURIDE

Vincent Haba, Trenton, N.J., assignor to Radio Corporation of America, a corporation of Delaware Original application Sept. 14, 1956, Ser. No. 609,940, now Patent No. 3,017,693, dated Jan. 23, 1962. Divided and this application Nov. 20, 1961, Ser. No. 153,443
5 Claims. (Cl. 136—5)

This application is a division of application Serial No. 609,940, filed September 14, 1956 and issued January 23, 1962 as U.S. Patent 3,017,693.

This invention relates to improved thermoelectric devices and to improved methods of fabricating such devices. More particularly the invention relates to improved materials and methods for providing mechanically strong low electrical resistance bonds between copper and bismuth telluride.

Bismuth telluride ($Bi_2Te_3$) is one of the most useful and efficient thermoelectric materials. When employed as a P-type thermoelectric material, thermal E.M.F.'s of +160 to +180 mv./° C. and resistivities as low as .0008 to .0012 ohm-cm. are obtained. In addition, the deviation from the Wiedemann-Franz-Lorenz ideal for thermoelectric materials is less than 2.7 (or a W.F.L. number of $6.615\times10^{-8}$ volts$^2$/deg. C.); this means that P-type bismuth telluride has an extremely low thermal conductivity. N-type bismuth telluride on the other hand has a thermal E.M.F. of between −170 to −200 mv./° C. and a resistivity between .0008 to .0006 ohm-cm.; its deviation from W.-F.-L. ideal is less than 3 or a W.-F.-L. number of $7.35\times10^{-8}$ volts$^2$/deg. C.

Most thermoelectric devices comprise single or multiple junctions between dissimilar metals. For example, two dissimilar metal wires may have their ends joined as by brazing to establish a thermoelectric junction therebetween. The free or unjoined ends of the wires may then be connected series-wise in a circuit to establish a second thermoelectric junction. If now the two junctions are at different temperatures, an electromotive force will be set up in the circuit thus formed. This effect is termed the Seebeck effect and a typical application is a thermocouple thermometer which is achieved by connecting a galvanometer series-wise in the circuit and reading the E.M.F. as a function of temperature difference. The opposite effect, that is a temperature increase and decrease, may be achieved at each junction respectively by passing a current through the junctions. This effect is termed the Peltier effect and a typical application is to make the "cold" junction of the refrigerating element in a refrigerator, for example.

Whether a thermoelectric material is N-type or P-type depends upon the direction of current flow across the cold junction formed by the thermoelectric material and another metal when operating as a thermoelectric generator according to the Seebeck effect. If the positive current direction at the cold junction is from the thermoelectric material, then it is termed "P-type"; if toward the thermoelectric material, then "N-type." The present invention relates to both N-type and P-type bismuth telluride and to bismuth telluride generally.

As already noted, a good thermoelectric material should have a low electrical resistivity since the thermal E.M.F. is dependent upon the temperature difference between the "hot" and "cold" junctions. The generation of Joulean heat in the system due to the electrical resistance of the thermoelectric elements or ancillary components thus reduces the system's efficiency. An otherwise suitable thermoelectric device employing low resistance thermoelectric bismuth telluride elements may operate ineffectively due to the electrical resistance in the bonds required to make electrical connections to these elements. For example, as will be described in greater detail hereinafter, it is usually desirable to braze, weld or solder copper elements to the N-type and P-type thermoelectric elements in devices operated according to the Peltier effect. In these devices a typical junction uses 30 amperes at 0.1 volt; hence, the Joulean heat created will be considerable at any high resistance contacts. High resistance contacts have been the bane of all investigators in Peltier cooling, as shown by the reporting of such values as: 6.3° C. cooling instead of the theoretical value of 11° C.; 16° C. cooling instead of the theoretical 26° C. These values demonstrate that about 39 to 40% of the theoretical cooling is lost because of contact resistances.

It is therefore an object of the instant invention to provide improved methods and materials for making low resistance electrical connections to bismuth telluride components.

Another object of the invention is to provide improved methods and materials for obtaining low resistance mechanically strong electrical connections to bismuth telluride components.

A further object of the invention is to provide improved methods and materials for obtaining low resistance mechanically strong electrical bonds between copper and bismuth telluride components.

Another object of the invention is to provide improved electrical connections to bismuth telluride components in thermoelectric devices.

Yet another object of the invention is to provide low resistance electrical connections between copper and bismuth telluride components.

Still another object of the invention is to provide an improved thermoelectric device capable of realizing at least 90% of the maximum theoretical cooling for bismuth telluride elements.

These and other objects and advantages of the instant invention are accomplished by first providing a bismuth telluride component with a finely roughened surface and employing a solder of tin, antimony, and bismuth. The bismuth telluride component is fluxed and then tinned with this solder at a temperature between 266° C. and 274° C. The copper element to be joined to the $Bi_2Te_3$ component is tinned with any conventional copper metal solder. The tinned surfaces of the bismuth telluride component and the copper element are pressed together while the copper is still hot (at a temperature of at least 200° C.) and then rapidly cooled. If the two bodies are not rapidly cooled, the solder on the bismuth telluride component tends to melt and roll away, resulting in a mechanically poor bond. Measured resistances of the contacts thus formed average less than .0009 ohm-cm. which is comparable to the resistance of the bismuth telluride components themselves.

The invention will be described in greater detail by reference to the drawing in which the sole figure is a partial cross-sectional elevation view of a bismuth telluride thermoelectric element bonded to a copper contact block.

Referring to the drawing, the thermoelectric bismuth telluride element 1 may be either N-type or P-type material. N-type $Bi_2Te_3$ is prepared by melting together bismuth and tellurium in stoichiometric proportions with minor impurity additions of copper sulfide for example. A typical N-type alloy consists of $Bi_2Te_3$ and about 1.24 wgt. percent of CuS and $Cu_2S$ in equal parts. P-type $Bi_2Te_3$ is prepared by melting 60 mol. percent bismuth, 20 mol. percent tellurium, 20 mol. percent antimony together with about 0.28 wgt. percent silver, and 0.56 wgt. percent selenium, the proportions of Ag and Se being based upon the total weight of the Te, Bi, and Sb.

As explained previously, a thermoelectric junction between the bismuth telluride and a dissimilar element is provided by bonding two such bodies together. Hence the practice is to solder, weld, or braze the $Bi_2Te_3$ element 1 to a copper block 3. Copper is preferred because of its low electrical resistance. As also explained heretofore, if the bond between the $Bi_2Te_3$ element and the copper block has too high an electrical resistance, an intolerable amount of Joulean heat is generated by the passage of current therethrough. Such heat lowers the effective thermal differential between adjacent "hot" and "cold" thermoelectric junctions, which in turn results in surrendering some 40% of the theortically possible cooling in a Peltier cooling device. Thus, in a Peltier cooling device employing the exemplary P-type and N-type bismuth telluride elements described heretofore, cooling is limited to about 31° C. with previous contacts instead of the attainable 52° C.

A low electrical resistance bond between the bismuth telluride element 1 and the copper block 3 is attained according to the invention as follows: The end of the $Bi_2Te_3$ element to be joined to the copper block is first given a finely-roughened or matte surface. A convenient method for achieving this is by vapor blasting the surface with a very fine suspended abrasive like pumice. Other honing techniques may also be employed. Thereafter this surface is fluxed with a saturated solution of lithium or zinc chloride in methyl alcohol.

Optimum wetting of the solder to P-type $Bi_2Te_3$ is obtained with lithium chloride, and in the case of N-type $Bi_2Te_3$ with zinc chloride. Other fluxes may be employed but none have been found to be as satisfactory as the lithium or zinc chloride fluxes. Likewise either of these fluxes may be used on either N-type or P-type $Bi_2Te_3$ with satisfactory but not optimal results.

The next step is to "tin" the fluxed surface of the bismuth telluride and this is accomplished by employing a tin-antimony-bismuth solder. In practice it was found that the best solder was one having the composition:

| | Percent |
|---|---|
| Tin | 47.5 |
| Antimony | 2.5 |
| Bismuth | 50.0 |

Excellent results are obtained however with a solder having a composition within the following ranges:

| | |
|---|---|
| Bismuth | 40 to 50%. |
| Antimony | 1.5 to 3.5%. |
| Tin | Balance. |

The best procedure in practicing the invention is to apply the flux by brushing and then dipping the fluxed end of the bismuth telluride in a pot of the solder. The temperature of the solder was found to be particularly critical being in the range of 266° C. to 274° C. The optimum temperature appears to be 274° C.

The next operation is to flux and "tin" the copper block although it should be understood that the fluxing and tinning operations of both the bismuth telluride and copper may be performed simultaneously so that the final steps in bonding the two may be carried out without interruption or delay. The copper may be fluxed with the same fluxes as employed for the bismuth telluride or any other known copper fluxes. Typical examples of a suitable flux for copper are zinc chloride or ammonium chloride. Likewise any of the known solders for copper may be employed including the one employed above for tinning the bismuth telluride. Typical solders for copper that may be used are: 60% Sn—40% Pb; tin (100%); or tin-antimony solders wherein the antimony content is not more than 10%. The copper is fluxed (as by brushing) and tinned on a hot plate at a temperature between 200° to 300° C.

With the copper block at a temperature substantially above the melting point of the bismuth-tin-antimony solder, preferably around 230° C., the tinned surface of the bismuth telluride is pressed into intimate contact against the tinned surface of the copper and then cooled rapidly by spraying part of the copper with water, for example, or by partially immersing the copper in water to solidify the solder. In general it is best not to bring the soldered joint in contact with water. Alternatively the copper block may be air-cooled. The actual soldering can be carried out at temperatures above 230° C. but since the tin-antimony-bismuth solder on the $Bi_2Te_3$ melts at temperatures below 200° (i.e., around 140° C.), excessively high temperatures cause excessive melting of this solder with the result that the solder rolls away or runs off the $Bi_2Te_3$. Temperatures below 200° C. on the other hand do not melt the solder sufficiently to achieve good bonding. Even at the optimum soldering temperature of 230° C. the solder in the $Bi_2Te_3$ tends to leave the $Bi_2Te_3$ surface hence the necessity for rapid cooling. Thus there is only a short time period during which an excellent bond between the copper and the $Bi_2Te_3$ can be achieved before the solder on the $Bi_2Te_3$ will start to part therefrom. In general it was found that the rapid cooling must be accomplished within 10 seconds and the higher the soldering temperature the faster the quenching must be accomplished.

This process leaves only a thin layer of solder intimately and strongly bonding the copper and bismuth telluride. The resistance per contact averages less than .0009 ohm-cm. which is within the same range of resistivity for P-type $Bi_2Te_3$ (.0008 to .0012 ohm-cm.) and N-type $Bi_2Te_3$ (.0008 to .0006 ohm-cm.). Typical measured contact resistance values of .000137 ohm-cm. and .00027 ohm-cm. were obtained. It is thus readily apparent that such contact resistances allow the attainment of above at least 90% of the maximum theoretical cooling for $Bi_2Te_3$ thermoelectric elements.

What is claimed is:

1. In a thermoelectric device, a bismuth telluride thermoelectric member and a copper body bonded thereto by a solder consisting of from 40–50% bismuth, 1.5–3.5% antimony, balance tin.

2. The invention according to claim 1, wherein said solder consists of 50% bismuth, 47.5% tin, and 2.5% antimony.

3. A low electrical resistance solder layer bonded to a bismuth telluride member, said solder layer comprising from 40–50% bismuth, 1.5–3.5 antimony, balance tin.

4. The invention according to claim 3, wherein said solder layer consists of 50% bismuth, 47.5% tin, and 2.5% antimony.

5. A thermoelectric device including a bismuth telluride thermoelectric element having a low electrical resistance solder layer bonded thereto, said solder layer consisting essentially of from 40–50% bismuth, 1.5–3.5% antimony, balance tin.

References Cited in the file of this patent

UNITED STATES PATENTS 2,877,283 Justi ---------------- Mar. 10, 1959